(12) United States Patent
Hirai et al.

(10) Patent No.: US 6,795,371 B2
(45) Date of Patent: Sep. 21, 2004

(54) SEMICONDUCTOR MEMORY APPARATUS OF WHICH DATA ARE ACCESSIBLE BY DIFFERENT ADDRESSING TYPE

(75) Inventors: Takayasu Hirai, Osaka (JP); Mitsuo Kaibara, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 3 days.

(21) Appl. No.: 10/270,990

(22) Filed: Oct. 14, 2002

(65) Prior Publication Data

US 2003/0086309 A1 May 8, 2003

(30) Foreign Application Priority Data

Oct. 15, 2001 (JP) .......................................... 2001-316918
Feb. 27, 2002 (JP) .......................................... 2002-051050

(51) Int. Cl.[7] ................................................ G11C 8/00
(52) U.S. Cl. .................. 365/233; 365/233; 365/230.03; 365/230.08; 365/230; 365/207; 365/189.05
(58) Field of Search ............................. 365/233, 230.03, 365/230.08, 203, 207, 189.05

(56) References Cited

U.S. PATENT DOCUMENTS

| 5,285,069 A | 2/1994 | Kaibara et al. |
| 6,105,082 A | 8/2000 | Hirai et al. |
| 6,606,277 B2 * | 8/2003 | Takahashi .................. 365/233 |

* cited by examiner

*Primary Examiner*—David Nelms
*Assistant Examiner*—Mai-Huong Tran
(74) *Attorney, Agent, or Firm*—Cooper & Dunham LLP

(57) ABSTRACT

A semiconductor memory apparatus allows accessing data stored therein using a plurality of different addressing types such as bit slice type and word slice type. The semiconductor memory apparatus includes memory elements having a plurality of memory cell arrays and corresponding column gates that control connections between the memory cell arrays and a first sense amp, a first write buffer, a second sense amp, and a second write buffer in response to an external signal designating the addressing type and the reading or writing of data.

7 Claims, 10 Drawing Sheets

FIG.2

| C | D | E | F | C | D | E | F | C | D | E | F | C | D | E | F |
|---|---|---|---|---|---|---|---|---|---|---|---|---|---|---|---|
| 8 | 9 | A | B | 8 | 9 | A | B | 8 | 9 | A | B | 8 | 9 | A | B |
| 4 | 5 | 6 | 7 | 4 | 5 | 6 | 7 | 4 | 5 | 6 | 7 | 4 | 5 | 6 | 7 |
| 0 | 1 | 2 | 3 | 0 | 1 | 2 | 3 | 0 | 1 | 2 | 3 | 0 | 1 | 2 | 3 |

0bit — 1bit — 2bit — 3bit

FIG.3

| 3 | 7 | B | F |
|---|---|---|---|
| 2 | 6 | A | E |
| 1 | 5 | 9 | D |
| 0 | 4 | 8 | C |

0–3bit — 0–3bit — 0–3bit — 0–3bit

SEMICONDUCTOR MEMORY APPARATUS OF WHICH DATA ARE ACCESSIBLE BY DIFFERENT ADDRESSING TYPE

BACKGROUND OF THE INVENTION

1. Field of the Invention

The present invention generally relates to a semiconductor memory apparatus such as an SRAM, and more particularly, to a semiconductor memory apparatus of which memory space is accessible by a plurality of different addressing methods.

2. Description of the Related Art

FIG. 6 is a block diagram showing the internal structure of a random access memory (RAM) 100 as an example of conventional semiconductor memory apparatuses. The RAM 100 is configured so that its memory space is addressed using (m×n) words×4 bits bit-slice type addressing method. FIG. 7 is a schematic diagram showing the three-dimensional memory space of the RAM showed in FIG. 6 in the case of m=n=4. FIG. 7 shows the case where Y=m (=4), X=n (=4), and Z=4.

When data are stored in the RAM 100, data items [A0, A1, A2, A3], [B0, B1, B2, B3], [C0, C1, C2, C3], AND [D0, D1, D2, D3], each having Z bits (=4, in this case) of data, are stored in respective addresses 0–3 as indicated on the top face of the memory space showed in FIG. 7. This addressing method is called "bit slice" type addressing.

In the following description, [A0, A1, A2, A3] will be written A[0:3], for example. Likewise, ADD[3:0] means [ADD3, ADD2, ADD1, ADD0], for example.

In the case of the conventional RAM 100, however, it is impossible to read the data as data items each having Y bits (=4, in this case) such as [A0, B0, C0, D0], [A1, B1, C1, D1], [A2, B2, C2, D2], and [A3, B3, C3, D3] using "word slice" type addressing.

If one uses four pieces of RAM 100 as a set as showed in FIG. 8, the user can read the data stored in the set of RAM 100 by the "word slice" type addressing method.

In FIG. 8, RAM 100a–100d has the same structure as the RAM 100 but it is assumed that m=n=2 in this case. An address control circuit 101 receives the following signals from a control circuit 102: address data ADD[3:0], a selection signal ZY-SEL indicating whether the data are to be accessed by the unit of Z bits or Y bits (that is, the bit slice type addressing or the word slice type addressing), and a chip enable signal CEB. The address control circuit 101 decodes the above signals and accesses RAM 100a–100d.

When the control circuit 102 gives the address control circuit 101 an instruction to access the memory space by Z bits (bit slice addressing) through the selection signal ZY-SEL and gives each RAM 100a –100d an instruction to write data by a low level write enable signal WEB, data DO[3:0] (DO3–DO0) output by the control circuit 102 are stored in the RAM 100a–100d controlled by the address control circuit 101 depending on the address data ADD [1:0].

In the RAM 100a, data are written in addresses by Z bits, that is, each address indicated as 0, 4, 8, C showed on the top face of FIG. 7. Likewise, in the RAM 100b, data are written in each address indicated as 1, 5, 9, D showed on the top face of FIG. 7. In the RAM 100c, data are written in each address indicated as 2, 6, A, E showed on the top face of FIG. 7. In the RAM 100d, data are written in each address indicated as 3, 7, B, F showed on the top face of FIG. 7. Only data A[0:3], B[0:3], C[0:3], D[0:3] are showed in FIG. 8.

In the case where the control circuit 102 gives the address control circuit 101 an instruction to access data by Y bits (word slice addressing), and the control circuit 102 further gives each RAM 100a –100d an instruction to read data by a high level write enable signal, the data designated by the address control circuit 101 are output through each data output terminal DOUT[3:0].

The data output terminal DOUT[3:0] of each RAM 100a–100d is connected to corresponding multiplexer MUXa–MUXd. Each multiplexer MUXa–MUXd selectively outputs 1 bit of the data output through the data output terminal DOUT[3:0]. Data of 4 bits in total are input to the data input terminal DI[3:0] of the control circuit 102. A bit selection signal BITSEL[3:0] indicating the position in the 4-bit data output from each data output terminal DOUT[3:0] is sent from the address control circuit 101 to the multiplexer MUXa–MUXd. Accordingly, the memory storage circuit showed in FIG. 8 can read Y-bit data stored in the addresses A0, B0, C0, and D0.

However, this configuration includes four sets of circuits, each controlling the operation of each RAM 100a–100d, and requires the external multiplexers MUXa–MUXd, which results in a large circuit area.

The circuit configuration showed in FIG. 8 realizes data writing by Z-bit and data reading by Y-bit. If one desires data writing by Y-bit and data reading by Z-bit, data writing and data reading by Z-bit, or data reading and data writing by Y-bit, he/she needs to provide additional circuits such as registers. The additional circuits increase the circuit area as well as wiring area.

SUMMARY OF THE INVENTION

Accordingly, it is a general object of the present invention to provide a novel and useful semiconductor memory apparatus in which one or more of the problems described above are eliminated.

Another and more specific object of the present invention is to provide a semiconductor memory apparatus of which data are accessible using different addressing types. A plurality of column gates are connected to the bit lines. Selection signals from an exterior designating which addressing type is to be used, bit slice type or word slice type, and column gate selection signals that are decoded address data from the exterior are input to each memory cell connected to the same word line. Accordingly, the semiconductor memory apparatus allows accessing data stored therein using different addressing types, and at the same time, the circuit area and the wiring region are reduced.

To achieve one or more of the above objects, a semiconductor memory apparatus according to the present invention, having a plurality of memory elements and a control circuit controlling each of the memory elements in response to control signals and address data input from an exterior, is characterized in that each of the memory elements includes a memory cell array in which a plurality of memory cells are arranged in a matrix with a plurality of pairs of bit lines on each column of the matrix and a plurality of word lines on each row of the matrix, each of the memory cells being connected to a corresponding pair of bit lines and corresponding one of the word lines, wherein a data signal is input to or output from the memory cells through the pair of bit lines and an enable signal is transferred to the corresponding memory cells through the corresponding one of the word lines, a first pair of data lines correspondingly provided to the memory cell array, a plurality of second pairs of data lines correspondingly provided to respective pairs of bit lines of the memory cell array, shared by the other memory elements, a plurality of column gates that connect, in response to a control signal from said control circuit, the corresponding pair of bit lines to the first pair of data lines or the corresponding one of the second pairs of data lines, a first sense amp that amplifies and outputs, when data are to be retrieved, in response to a control signal from the control circuit, the signal output through the first pair of data lines, a first write buffer that stores, when data are to be stored, in response to a control signal from the control circuit, the data in desired one of the memory cells through the first pair of data lines, a second sense amp that amplifies and outputs, when data are to be retrieved, in response to a control signal from the control circuit, the signal output through the second pair of data lines, a second write buffer that stores, when data are to be stored, in response to a control signal from the control circuit, the data in desired one of the memory cells through the second pair of data lines.

When accessing the memory cell array by Z bits, each column gate in the memory elements, in response to a control signal from the control circuit, connects the corresponding pair of bit lines to the enabled first sense amp and the enabled first write buffer through the first pair of data lines (bit slice type addressing by Z bits).

When accessing the memory cell array by Y bits, each column gate in the memory element, in response to a control signal from the control circuit, connects the corresponding pair of bit lines to the enabled second sense amp and the enabled second write buffer through the second pair of data lines (word slice type addressing by Y bits).

Other objects, features, and advantages of the present invention will become more apparent from the following detailed description when read in conjunction with the accompanying drawings.

BRIEF DESCRIPTION OF THE DRAWINGS

FIG. 2 is a schematic diagram for explaining bit slice type addressing;

FIG. 3 is a schematic diagram for explaining word slice type addressing;

DETAILED DESCRIPTION OF THE PREFERRED EMBODIMENTS

The preferred embodiments of the present invention will be described in detail by reference to the drawings.

Figure 1:
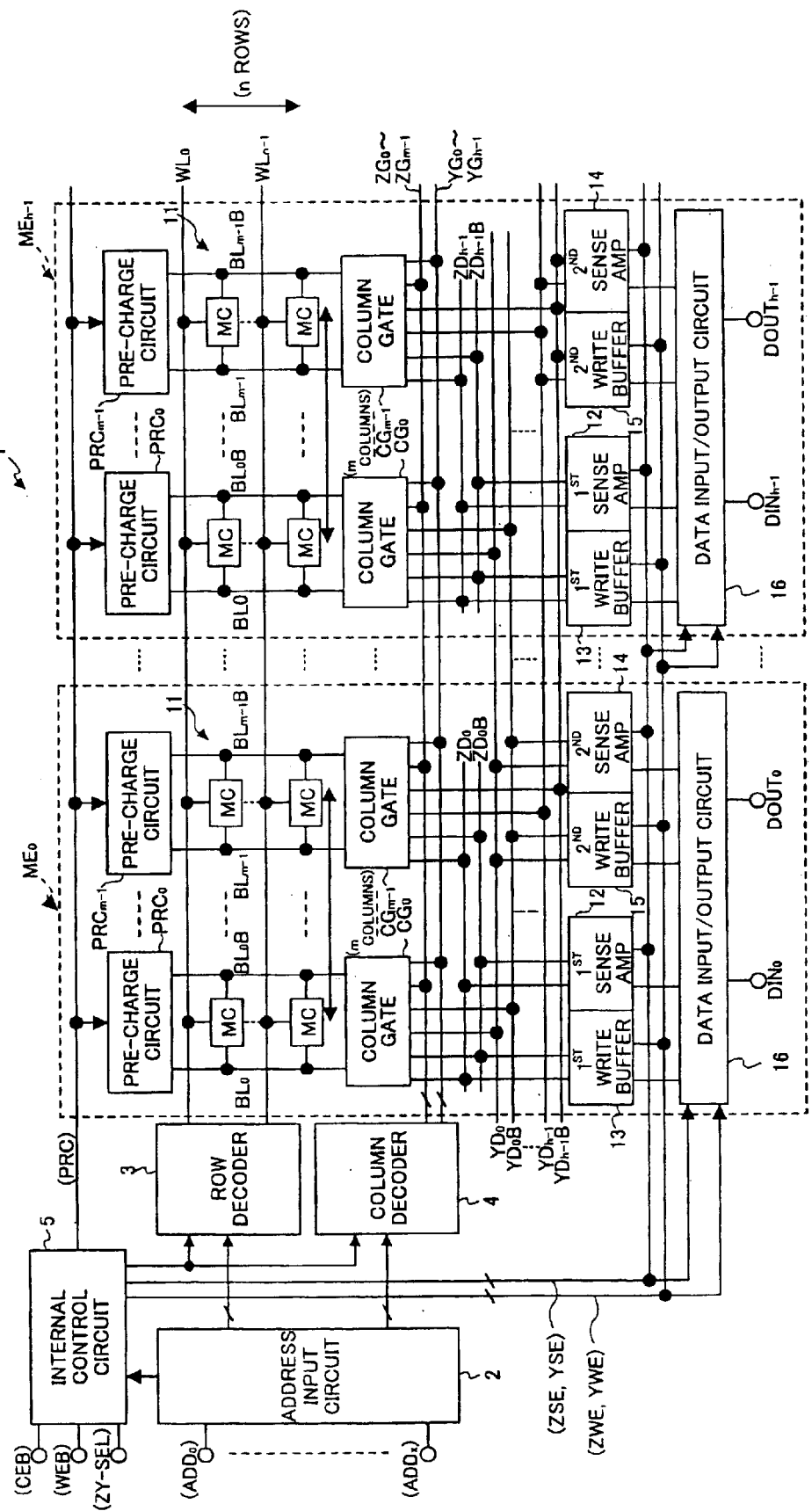
FIG. 1 is a block diagram showing a semiconductor memory apparatus according to the first embodiment of the present invention.

FIG. 1 is a block diagram showing a semiconductor memory apparatus 1 according to an embodiment of the present invention. The semiconductor memory apparatus 1 showed in FIG. 1 has a memory space of (m×n) words×(h) bits, where m, n, and h are natural numbers and m≦h.

In FIG. 1, the semiconductor memory apparatus 1 is provided with the following: an address input circuit 2 to which address data ADD0–ADDx (x is a natural number) are input from the exterior, a row decoder 3 that controls word lines $WL_0$–$WL_{n-1}$, a column decoder 4, and memory elements $ME_0$–$ME_{h-1}$ each of which has a memory array including "m columns×n rows" SRAM type memory cells. The semiconductor memory apparatus 1 further includes an internal control circuit 5 that controls the row decoder 3, the column decoder 4, and the memory elements $ME_0$–$ME_{h-1}$. The address input circuit 2, the row decoder 3, the column decoder 4, and the internal control circuit 5 constitute a control circuit that controls the memory elements $ME_0$–$ME_{h-1}$.

Since each memory element $ME_0$–$ME_{h-1}$ is identically configured, the internal structure of a memory element $ME_i$ (i=0–h−1) will be described. The memory element $ME_i$ is provided with a memory cell array 11 consisting of "m columns×n rows" SRAM type memory cells MC, and pre-charge circuits $PRC_0$–$PRC_{m-1}$ that pre-charges pairs of bit lines ($BL_0$, $BL_0B$), ($BL_1$, $BL_1B$), . . . , ($BL_{m-1}$, $BL_{m-1}B$).

The memory element $ME_i$ is provided with column gates $CG_0$–$CG_{m-1}$, a first sense amp 12, a first write buffer 13, a second sense amp 14, and a second write buffer 15. The column gate $CG_0$–$CG_{m-1}$ connects the pair of bit lines connected to itself, to a pair of data lines in response to a control signal from the column decoder 4. The memory element $ME_i$ is further provided with a data input/output circuit 16 that receives input data through the input terminal $DIN_i$ and sends the input data to the first write buffer 13 and the second write buffer 15. The data input/output circuit 16 further receives output data from the first sense amp 12 and the second sense amp 14, and outputs the output data through the output terminal $DOUT_i$.

In the following description of the bit slice type addressing and the word slice type addressing, it will be assumed that m=n=h=4 for each memory element $ME_0$–$ME_{h-1}$. In this case, the memory elements $ME_0$–$ME_{h-1}$ have a 3-dimensional memory space showed in FIG. 7.

FIG. 2 is a schematic diagram for explaining the bit slice type addressing, and FIG. 3 is a schematic diagram for explaining the word slice type addressing.

Figure 7:
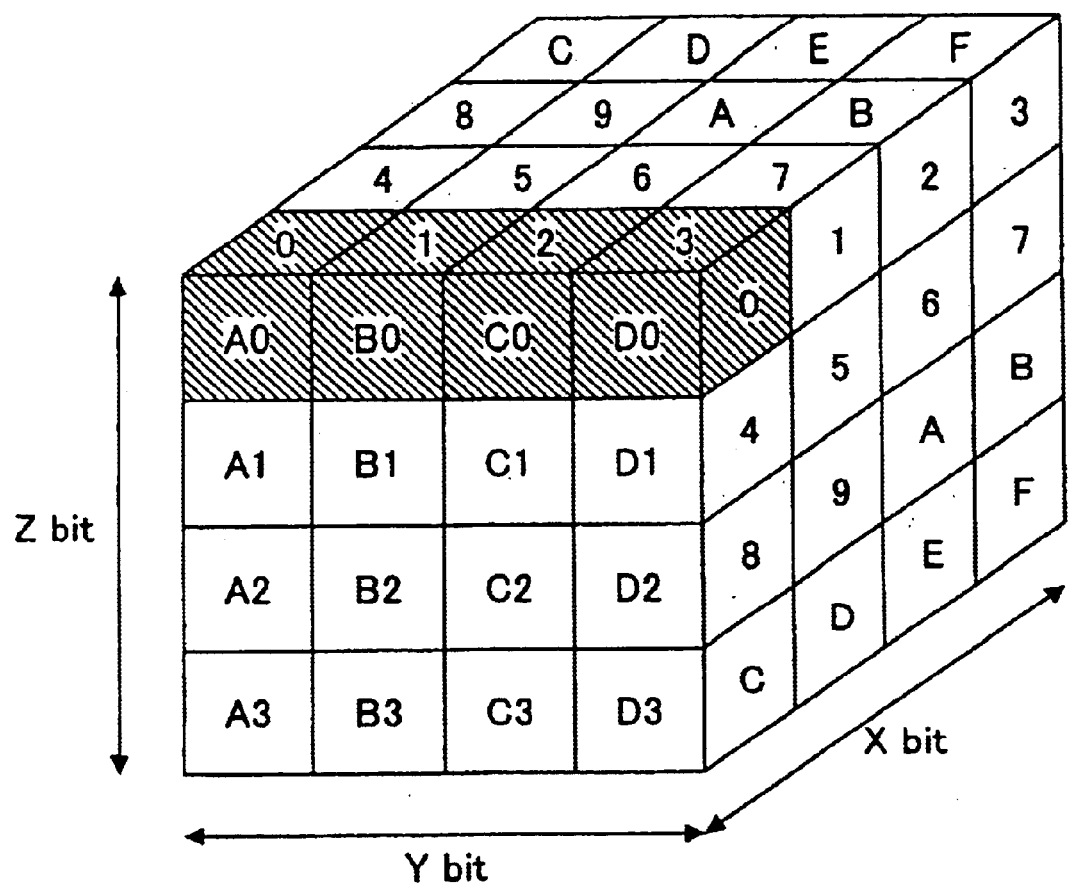
FIG. 7 is a 3-dimensional schematic diagram showing a memory space.
Figure 8:
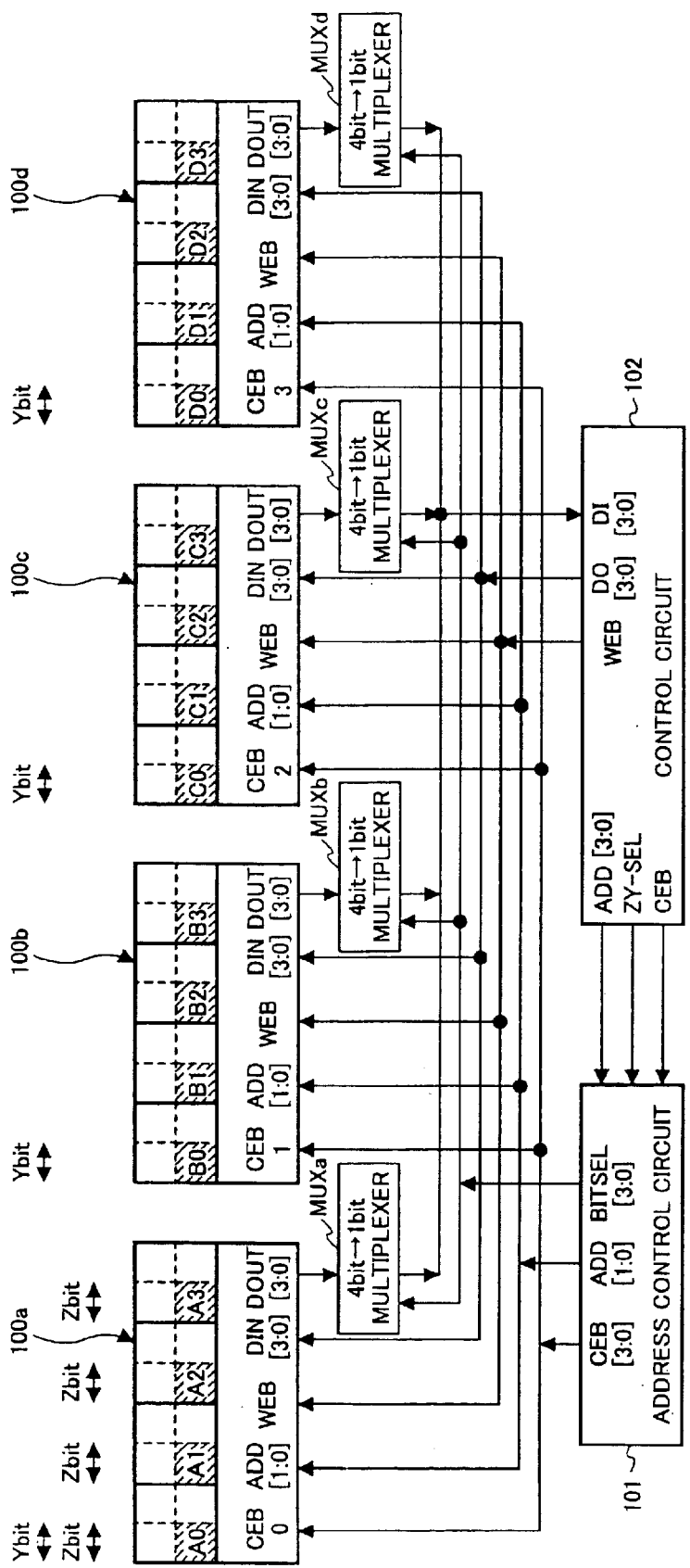
FIG. 8 is a block diagram showing a memory circuit using a plurality of RAM 100 showed in FIG. 6.

In FIG. 7, the pair of a character and a numeral A0–A3, B0–B3, C0–C3, and D0–D3 indicated in the front face of the 3-dimensional memory space indicates an item of data stored in each of the "4×4" memory regions.

In addition, a hexadecimal numeral 0-F indicated in the top face of the 3-dimensional memory space in FIG. 7 indicates an address of data in the case where Z bits such as [A0, A1, A2, A3] (address "0") are regarded as a set of data (bit slice addressing).

Furthermore, a hexadecimal numeral 0-F indicated in the right face of the 3-dimensional memory space in FIG. 7 indicates an address of data in the case where Y bits such as [A0, B0, C0, D0] (address "0") are regarded as a set of data (word slice addressing).

FIG. 2 is a schematic diagram showing the corresponding relationship between the memory cells MC showed in FIG. 1 and the address of data indicated by the bit slice addressing (showed on the top face of the 3-dimensional memory space in FIG. 7). The first 4×4 memory cells on the left in FIG. 2 correspond to the memory cells in the memory element $ME_0$ in FIG. 1. Likewise, the second, third, and fourth 4×4 memory cells from the left in FIG. 2 correspond to the memory cells in the memory elements $ME_1$, $ME_2$, and $ME_3$, respectively, showed in FIG. 1.

In other words, in the case of the bit slice type addressing, an address indicated by the bit slice type addressing (showed on the top face of the 3-dimensional memory space in FIG. 7) is assigned to each memory cell MC in the memory cell array 11 of the memory elements $ME_0$–$ME_{h-1}$.

For example, the data [A0, A1, A2, A3] showed in FIG. 7 are correspondingly stored in the memory cells indicated as "0" in FIG. 2.

FIG. 3 is a schematic diagram showing the corresponding relationship between the memory cells MC showed in FIG. 1 and the address of data indicated by the word slice addressing (showed on the right face of the 3-dimensional memory space in FIG. 7).

In the case of the word slice type addressing, an address indicated by the word slice type addressing (showed on the right face of the 3-dimensional memory space in FIG. 7) is assigned to each memory cell MC in the memory cell array of the memory elements $ME_0$–$ME_{h-1}$.

For example, 4 bit data [A0, B0, C0, D0] showed in FIG. 7 are stored in the memory cells indicated as address "0" in FIG. 3 (shaded).

The first sense amp 12 is activated when data are read from memory cells addressed by the bit slice type addressing (Z bits as a unit), and the first write buffer 13 is activated when data are written in memory cells addressed by the bit slice type addressing (Z bits as a unit). On the other hand, the second sense amp 14 is activated when data are read from memory cells addressed by the word slice type addressing (Y bits as a unit), and the second write buffer 15 is activated when data are written in memory cells addressed by the word slice type addressing (Y bits as a unit).

The internal control circuit S gives the column decoder 4 an instruction whether to access the memory cell array 11 by the bit slice addressing or the word slice addressing through a control signal. The column decoder 4 is connected with each column gate $CG_0$–$CG_{m-1}$ through both signal lines $ZG_0$–$ZG_{m-1}$ for the bit slice type addressing (Z bit as the unit) and signal lines $YG_0$–$YG_{h-1}$ for the word slice type addressing (Y bit as the unit).

The column gates $CG_0$–$CG_{m-1}$ are connected with both the first sense amp 12 and the first write buffer 13 through a pair of data lines $ZD_i$ and $ZD_iB$ for the bit slice addressing (Z bit as the unit). At the same time, the column gates $CG_0$–$CG_{m-1}$ are connected with both the second sense amp 14 and the second write buffer 15 through data lines $YD_0$, $YD_0B$, ..., $YD_{h-1}$, $YD_{h-1}B$.

The first sense amp 12 and the second sense amp 14 are connected with the data output terminal $DOUT_i$ via the data input/output circuit 16. The first write buffer 13 and the second write buffer 15 are connected with the data input terminal $DIN_i$ via the data input/output circuit 16. The data lines $ZD_0$, $ZD_0B$, ..., $ZD_{h-1}$, $ZD_{h-1}B$ are referred to as the first pairs of data lines. The data lines $YD_0$, $YD_0B$, $YD_{h-1}$, $YD_{h-1}B$ are referred to as the second pairs of data lines.

When the address data ADD0–ADDx are input, the address input circuit 2 outputs the input address data ADD0–ADDx to the row decoder 3 and the column decoder 4, and further outputs a prescribed signal to inform the internal control circuit 5 of the reception of the address data. In response to reception of the prescribed signal, the internal control circuit 5 sends a high level pre-charge control signal PRC to each pre-charge circuit $PRC_0$–$PRC_{m-1}$ to cause the pre-charge circuit $PRC_0$–$PRC_{m-1}$ to perform a predetermined pre-charge operation. All bit lines $BL_0$, $BL_0B$, ..., $BL_{m-1}$, $BL_{m-1}B$ of the memory cell array 11 are pre-charged by the activated pre-charge circuit $PRC_0$–$PRC_{m-1}$.

When the pre-charge circuits $PRC_0$–$PRC_{m-1}$ complete the pre-charging, the internal control circuit 5 sets the pre-charge control signal PRC at a low level to cause the pre-charge circuits $PRC_0$–$PRC_{m-1}$ to stop pre-charging. At the same time, the internal control circuit 5 activates the row decoder 3 and the column decoder 4, and gives the column decoder 4 an instruction to access the memory space by either the bit slice addressing (Z bits as the unit) or the word slice type addressing (Y bits as the unit), in response to an external selection signal ZY-SEL designating the addressing method, the bit slice type (Z bits as the unit) or the word slice type (Y bits as the unit).

Furthermore, the internal control circuit 5, in response to the selection signal ZY-SEL and the external write enable signal WEB, controls the activation of the first sense amp 12, the second sense amp 14, the first write buffer, and the second write buffer 15 to control the operation of the data input/output circuit 16.

When the internal control circuit 5 gives the column decoder 4 an instruction to access the memory cell array 11 by the bit slice type addressing (Z bits as the unit) by sending a control signal, the column decoder 4 outputs a control signal to the control signal lines $ZG_0$–$ZG_{m-1}$ for the bit slice type addressing of Z bits as the unit based on the address data input from the address input circuit 2 so that one of the column gates $CG_0$–$CG_{m-1}$ becomes enabled. At the same time, the column decoder 4 sets the control signals output to the respective control signal lines $YG_0$–$YG_{h-1}$ for the word slice addressing by Y bits as the unit at a disabled state. The column gate selected by the column decoder 4 outputs data from a corresponding pair of bit lines to a data line pair $ZD_i$ and $ZD_iB$ for addressing by Z bits as the unit.

In addition, the internal control circuit 5 sends a control signal to cause the column decoder 4 to access the memory space by the word slice type addressing (Y bits as the unit). In response to the control signal, the column decoder 4 sets one of the control signal lines $YG_0$–$YG_{h-1}$ for addressing by Y bits as the unit at an enable state so that each column gate $CG_0$–$CG_{m-1}$ in a desired memory element based on the address data input from the address input circuit 2 is enabled. At the same time, the column decoder 4 sets each control signal on the control signal lines $ZG_0$–$ZG_{m-1}$ at a disabled state. The column gates $CG_0$–$CG_{m-1}$ selected by the column decoder 4 output data obtained from the corresponding pairs of bit lines to the corresponding pairs of data lines $YD_0$, $YD_0B$–$YD_{h-1}$, $YD_{h-1}B$.

When writing data by Z bits, the internal control circuit 5 enables the first write buffer 13 by sending a prescribed write control signal ZWE to the first write buffer 13 and disables the first sense amp 12, the second sense amp 14, and the second write buffer 15. When reading data by Z bits, the internal control circuit 5 enables the first sense amp 12 by sending a prescribed control signal ZSE to the first sense amp 12 and disables the first write buffer 13, the second sense amp 14, and the second write buffer 15.

When writing data by Y bits, the internal control circuit 5 enables the second write buffer 15 by sending a prescribed write control signal YWE to the second write buffer 15 and disables the first sense amp 12, the first write buffer 13, and the second sense amp 14. When reading data by Y bits, the internal control circuit 5 enables the second sense amp 14 by sending a prescribed control signal YSE to the second sense amp 14 and disables the first sense amp 12, the first write buffer 13, and the second write buffer 15.

Furthermore, when writing data, the internal control circuit 5 causes the data input/output circuit 16 to receive input data from the data input terminal $DIN_i$ and to send the input data to the first write buffer 13 and the second write buffer 15. When reading data, the internal control circuit 5 causes the data input/output circuit 16 to receive output data from either the first sense amp 12 or the second sense amp 14 and send the output data to the data output terminal $DOUT_i$.

On the other hand, the address data from the address input circuit 2 are decoded by the row decoder 3 and the column decoder 4. The row decoder 3 activates the word lines connected to memory cells MC addressed by the address data. The column decoder 4 receives a control signal indicating whether to access the memory cell array 11 by Z bits or Y bits from the internal control circuit 5. When accessing by Z bits, the column decoder 4 outputs a control signal based on the address data input by the address input circuit 2 to the control signal lines $ZG_0$–$ZG_{m-1}$ for accessing by Z bits, and the column decoder 4 sets the control signal output to the control signal lines $YG_0$–$YG_{h-1}$ for accessing by Y bits at a disabled state.

When accessing the memory cell array 11, the column decoder 4 enables only one of the control signals $YG_0$–$YG_{h-1}$ for addressing by Y bits based on the address data input by the address input circuit 2 and disables all of the control signals $ZG_0$–$ZG_{m-1}$ for addressing by Z bits.

Since all column gates $CG_0$–$CG_{m-1}$ are identically configured, the operation of a column gate $CG_k$ (k=0–m–1) will be described below.

Figure 4:
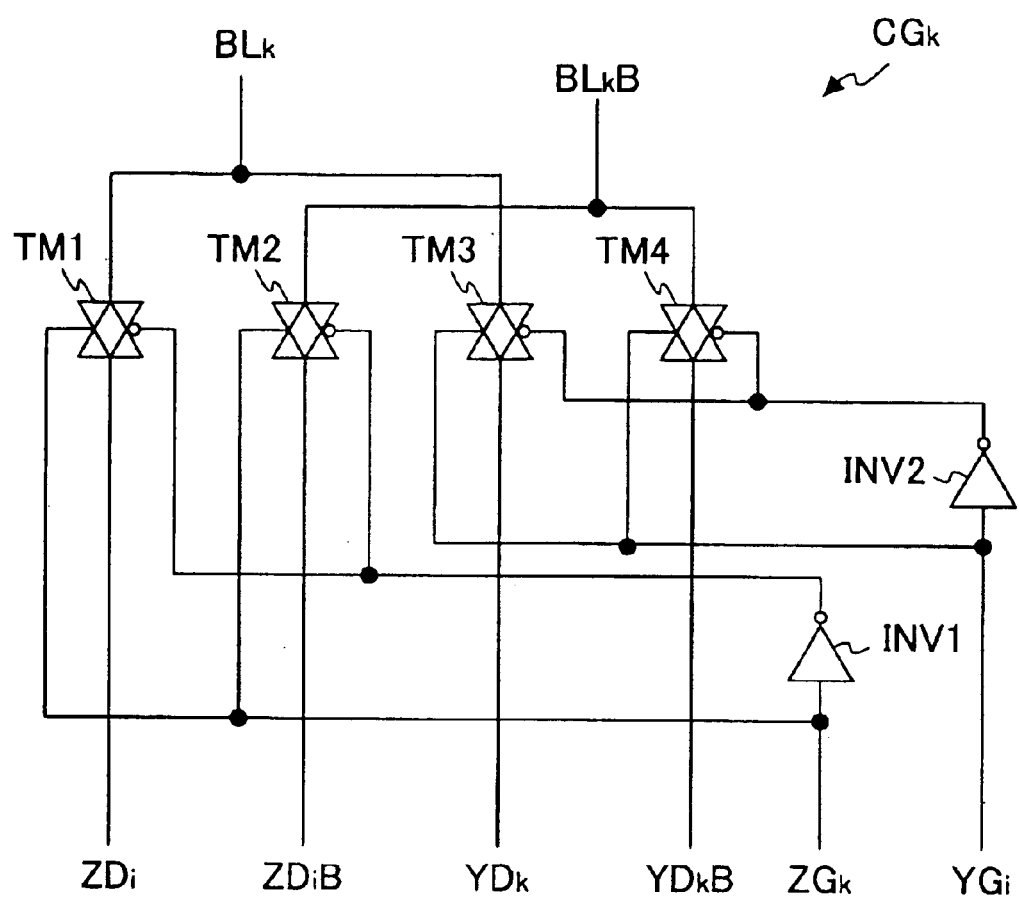
FIG. 4 is a circuit diagram showing a column gate $CG_k$ of a memory element $ME_i$, showed in FIG. 1.

FIG. 4 is a circuit diagram showing the circuit of the column gate $CG_k$ in the memory element $ME_i$. As showed in FIG. 4, the column gate $CG_k$ is configured by transmission gates TM1–4 and inverters INV1 and INV2.

The transmission gate TM1 controls the connection between the bit line $BL_k$ and the data line $ZD_i$ for addressing by Z bits; the transmission gate TM2 controls the connection between the bit line $BL_k$B and the data line $ZD_i$B for addressing by Z bits; the transmission gate TM3 controls the connection between the bit line $BL_k$ and the data line $YD_k$ for addressing by Y bits; and the transmission gate TM4 controls the connection between the bit line $BL_k$B and the data line $YD_k$B for addressing by Y bits. Each of the transmission gates TM1–TM4 is configured by a PMOS transistor and an NMOS transistor connected in parallel. In the following description, the gate of the PMOS transistor is called an inverted control input terminal, and the gate of the NMOS transistor is called a non-inverted control input terminal.

The non-inverted control input terminals of the transmission gates TM1 and TM2 are connected to the control signal lines $ZG_k$ for addressing by Z bits. The control signal line $ZG_k$ for addressing by Z bits is connected to the inverted control input terminals of the transmission gates TM1 and TM2 via an inverter INV1. The non-inverted control input terminals of the transmission gates TM3 and TM4 are connected to the control signal line $YG_i$ for addressing by Y bits. The control signal line $YG_i$ for addressing by Y bits is connected to the inverted control input terminals of the transmission gates TM3 and TM4 through an inverter INV2.

When accessing the memory cell array 11 by Z bits, the column decoder 4 sets the control signal line $ZG_k$ at a high (enable) level, and the transmission gates TM1 and TM2 are turned on (at a conductive state). At the same time, the control signal on the control signal line $YG_i$ for accessing by Y bits is set at a low level (disabled state) so that the transmission gates TM3 and TM4 are turned off (non-conductive state). The bit line pairs $BL_k$ and $BL_k$B are connected to the data line pairs $ZD_i$ and $ZD_i$B, respectively.

When accessing the memory cell array 11 by Y bits, the column decoder 4 sets the control signal on the control signal line $YG_i$ for accessing by Y bits at a high level (enabled state), and the transmission gates TM3 and TM4 are turned on (conductive state). Concurrently, the control signal on the control signal lines $ZG_k$ for accessing by Z bits is turned to a low level (disable state) so that the transmission gates TM1 and TM2 are turned off (non-conductive state).

Accordingly, the bit line pair $BL_k$ and $BL_k$B are connected to the data line pair $YD_k$ and $YD_k$B, respectively. The column decoder 4 outputs the control signals so that the bit line pair $BL_k$ and $BL_k$B are not connected to both the data line pair $ZD_i$, $ZD_i$B for accessing by Z bits and the data line pair $YD_k$, $YD_k$B at the same time.

The operation of the semiconductor memory apparatus 1 of (4×4) words×4 bits (m=n=h=4) will be described below.

In the case of the bit slice addressing (the addressing by Z bits), the column decoder 4 sets one of the control signals $ZG_0$–$ZG_3$ (for the addressing by Z bits) at a high level (enable state) and further sets the control signals $YG_0$–$YG_3$ (for the addressing by Y bits) at a low level (disable state).

In the case of the word slice addressing (the addressing by Y bits), the column decoder 4 sets one of the control signals $YG_0$–$YG_3$ (for the addressing by Y bits) at a high level (enable state) and further sets the control signals $ZG_0$–$ZG_3$ (for the addressing by Z bits) at a low level (disable state)

The control signals $ZG_0$–$ZG_3$ are connected to corresponding column gates $CG_0$–$CG_3$ provided in each of memory elements $ME_0$–$ME_3$. For example, the control signal $ZG_0$ is connected to the column gates $CG_0$ provided in each memory elements $ME_0$–$ME_3$. On the other hand, the control signals $YG_0$–$YG_3$ are connected to the column gates $CG_0$–$CG_3$ in corresponding memory elements $ME_0$–$ME_3$. For example, the control signal $YG_0$ is connected to all column gates $CG_0$–$CG_3$ provided in the corresponding memory element $ME_0$.

Each column gate $CG_0$–$CG_3$ is connected to the data line pair (for the addressing by Z bits) ($ZD_0$, $ZD_0$B)–($ZD_3$, $ZD_3$B) and the data line pair (for the addressing by Y bits) ($YD_0$, $YD_0$B)–($YD_3$, $YD_3$B) In addition, the data line pair (for the addressing by Z bits) ($ZD_0$, $ZD_0$B)–($ZD_3$, $ZD_3$B) are connected to the first sense amp 12 and the first write buffer 13 provided in the corresponding memory element $ME_0$–$ME_3$. The data line pair (for the addressing by Y bits) ($YD_0$, $YD_0$B)–($YD_3$, $YD_3$B) are connected to the second sense amp 14 and the second write buffer 15 provided in the corresponding memory element $ME_0$–$ME_3$.

The first sense amp 12 provided in each memory element $ME_0$–$ME_3$ outputs data to the data input/output circuit 16 in response to the control signal ZSE from the internal control circuit 5. The first write buffer 13 provided in each memory element $ME_0$–$ME_3$ inputs data from the data input/output circuit 16 in response to the control, signal ZWE from the internal control circuit 5. Similarly, the second sense amp 14 provided in each memory element $ME_0$–$ME_3$ outputs data to the data input/output circuit 16 in response to the control signal YSE from the internal control circuit 5. The second write buffer 15 provided in each memory element $ME_0$–$ME_3$ inputs data from the data input/output circuit 16 in response to the control signal YWE from the internal control circuit 5.

In the embodiment described above, the column gate $CG_0$–$CG_{m-1}$ includes four transmission gates, two each of which are connected to the bit line pair $BL_k$ and $BL_kB$. If addressing in a different manner is desired, one may increase the number of transmission gates provided in each column gate $CG_0$–$CG_{m-1}$ and change the configuration of the data line pairs and so forth in accordance with the increase in number of the transmission gates by providing a plurality of selection signals ZY-SEL.

The embodiment described above is the case where the number "Z" and the number "Y" are equal. However, even in the case where the number "Z" and the number "Y" are different, the semiconductor memory apparatus 1 can achieve the object of the present invention by adjusting the number of the data line pairs $ZD_i$ and $ZD_iB$, the number of the data line pairs $YD_i$ and $YD_iB$, the number of the sense amps, and the number of the write buffers.

Figure 5:
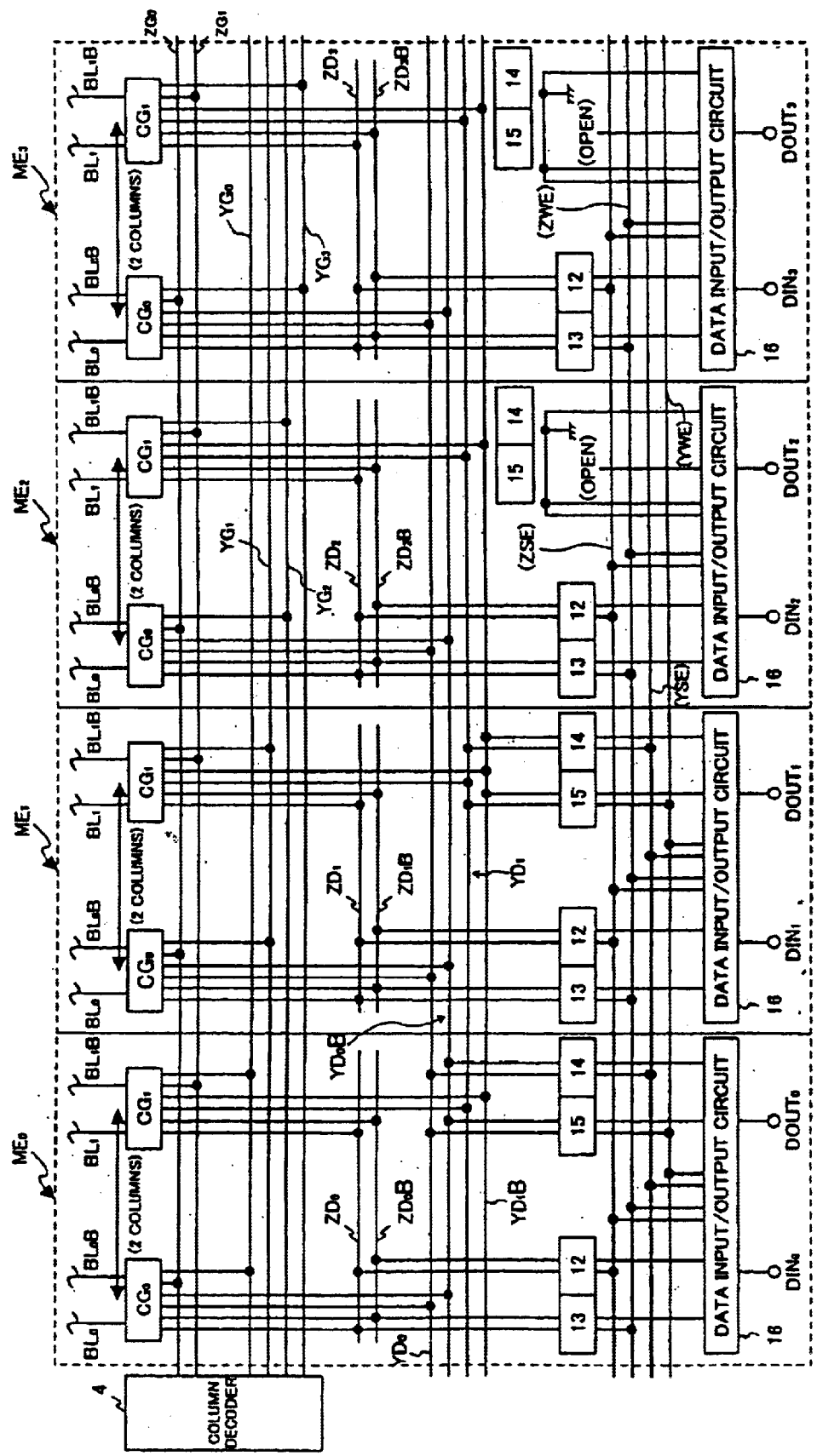
FIG. 5 is a block diagram showing the semiconductor memory apparatus according to the first embodiment of the present invention in the case of m=2 and h=4.
Figure 6:
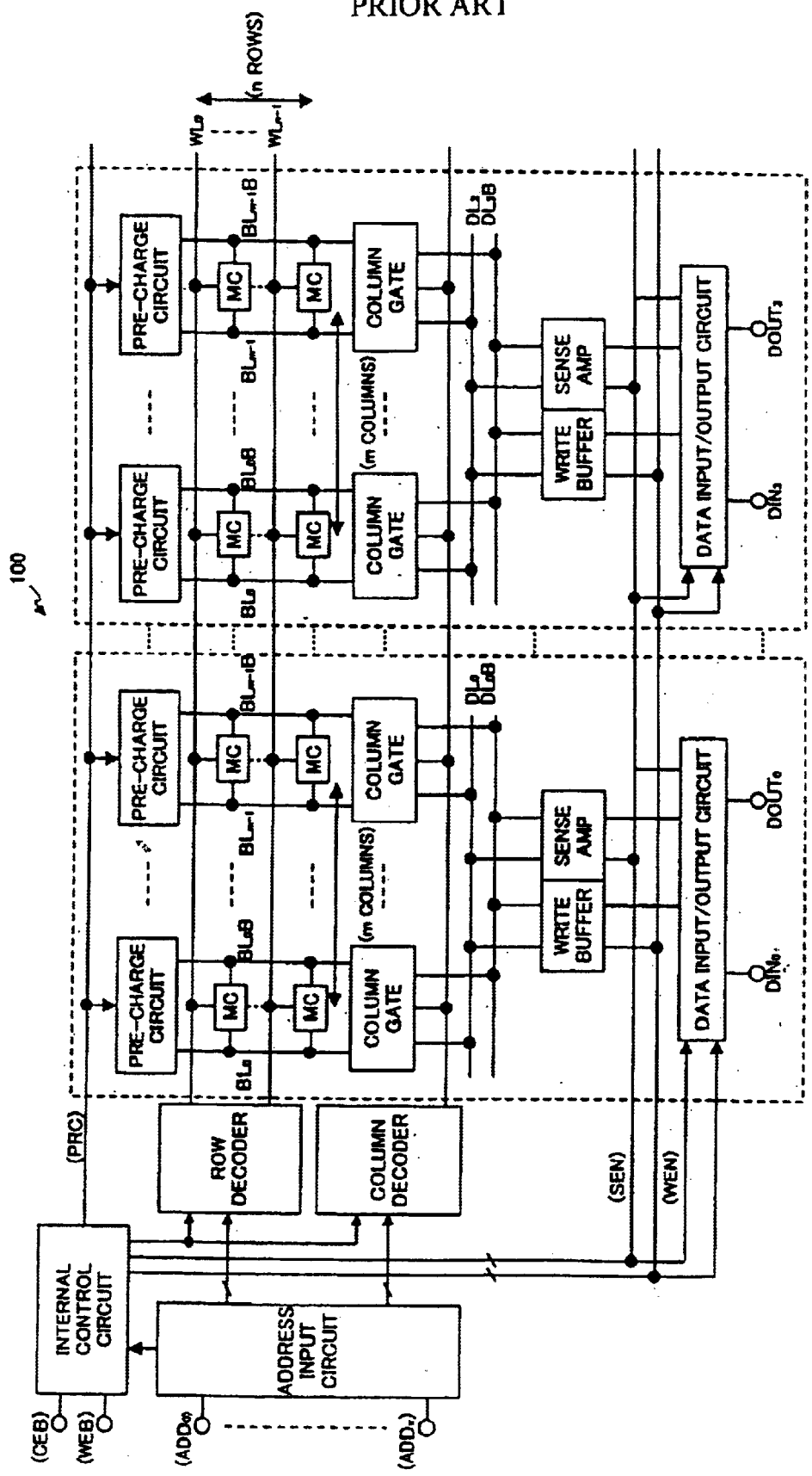
FIG. 6 is a block diagram showing the internal structure of a RAM as an example of conventional semiconductor apparatuses.

FIG. 5 is a block diagram showing a semiconductor memory apparatus in the case where m=2, h=4. FIG. 5 shows column decoders, column gates, sense amps, write buffers, the data input/output circuits, and their connections. The other portions are not showed in FIG. 5.

The semiconductor memory apparatus showed in FIG. 5 is different from the semiconductor memory apparatus 1 showed in FIG. 1 in that each data input/output circuit 16 of the memory elements $ME_2$ and $ME_3$ is not connected to the second sense amp 14 and the second write buffer 15 and is not provided with the control signals YSE and YWE. Each input terminal to which the control signal YSE and YWE is input is grounded. The input terminal of the data input/output circuit 16 of the memory element $ME_2$ and $ME_3$ to which the second sense amp 14 is connected may be fixed at a high level or a low level. The output terminal of the data input/output circuit 16 of the memory element $ME_2$ and $ME_3$ to which the second write buffer 15 is connected may be left open.

In the case of accessing the memory cell array 11 by Y bits, each data input/output circuit 16 of the memory elements $ME_2$ and $ME_3$ does not accept input data from the input terminals $DIN_2$ and $DIN_3$, and the output terminals $DOUT_2$ and $DOUT_3$ may remain at the same output state as the adjacent one or may be set at a high impedance state. In each memory element in FIG. 5, the reference numerals 12, 13, 14, and 15 refer to the first sense amp, the first write buffer, the second sense amp and the second write buffer, respectively. "$CG_0$" and "$CG_1$" stands for column gates.

In FIGS. 1 and 5, the case of m≦h has been described. The case of m>h will be described below.

Figure 9:
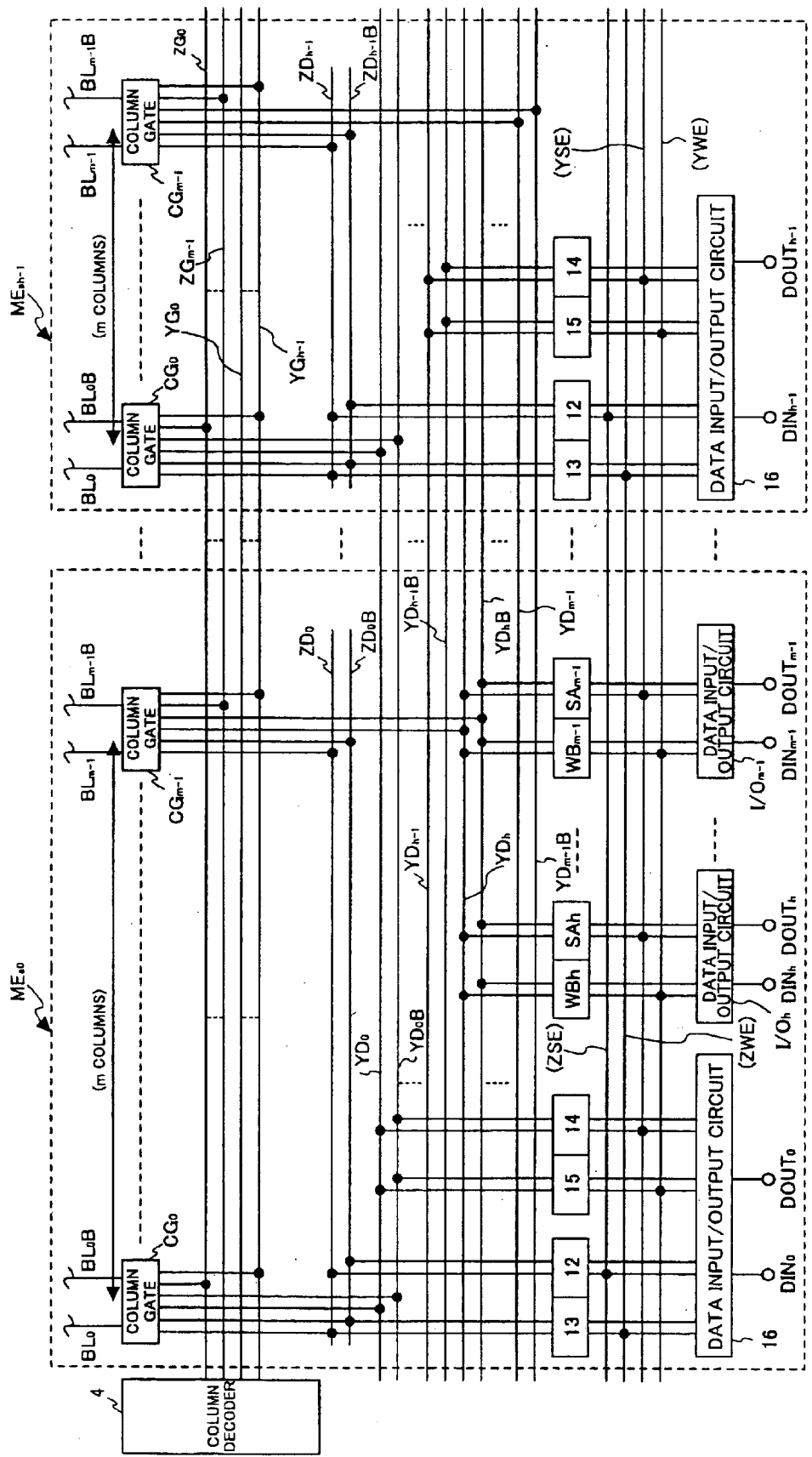
FIG. 9 is a block diagram showing another example of the semiconductor memory apparatus according to the embodiment of the present invention.

FIG. 9 is a block diagram showing another example of the semiconductor memory apparatus in the case of m>h according to the embodiment of the present invention. In FIG. 9, the address input circuit 2, the row decoder 3, the internal control circuit 5, the memory cell array 11, and the pre-charge circuit $PRC_0$–$PRC_{m-1}$ described in FIG. 9, which are the same as FIG. 1, are omitted. What is common in FIGS. 1 and 9 are referred to by the same numerals and their description is omitted. Only the differences will be described below.

The difference in the semiconductor memory apparatuses showed in FIGS. 9 and 1 is that, because of the condition "m>h", the data line pairs for accessing by Y bits showed in FIG. 1 ($YD_0$, $YD_0B$)–($YD_{h-1}$, $YD_{h-1}B$) are replaced by the data line pairs for accessing by Y bits ($YD_0$, $YD_0B$)–($YD_{m-1}$, $YD_{m-1}B$) Additionally, second sense amps $SA_h$–$SA_{m-1}$, second write buffers $WB_h$–$WB_{m-1}$, and data input/output circuits $I/O_h$–$I/O_{m-1}$ are added. Accordingly, the semiconductor memory apparatus of FIG. 9 is referred to as "1a".

The semiconductor memory apparatus 1a is provided with the following: an address input circuit 2, a row decoder 3, a column decoder 4, memory elements $MEa_0$–$MEa_{h-1}$, each having a memory cell array of "m columns×n rows" SRAM memory cells, and an internal control circuit 5. The address input circuit 2, the row decoder 3, the column decoder 4, the internal control circuit 5 are included in a control circuit that controls each memory element $MEa_0$–$MEa_{h-1}$.

Each memory element $MEa_0$–$MEa_{h-1}$ is provided with the following: a memory cell array 11, pre-charge circuits $PRC_0$–$PRC_{m-1}$, column gates $CG_0$–$CG_{m-1}$, a first sense amp 12, a first write buffer 13, a second sense amp 14, and a second write buffer 15. Additionally, each memory element $MEa_0$–$MEa_{h-1}$ is provided with second sense amps $SA_h$–$SA_{m-1}$ and second write buffers $WB_h$–$WB_{m-1}$.

Each memory element $MEa_0$–$MEa_{h-1}$ is provided with data input/output circuits $I/O_h$–$I/O_{m-1}$ that output data signals output from the corresponding second sense amps $SA_h$–$SA_{m-1}$ to the corresponding output terminals. $DOUT_h$–$DOUT_{m-1}$, and output data signals input from the corresponding input terminals $DIN_h$–$DIN_{m-1}$ to the corresponding second write buffers $WB_h$–$WB_{m-1}$, respectively. Only the control signals YSE and YWE are input from the internal control circuit 5 to the data input/output circuits $I/O_h$–$I/O_{m-1}$.

FIG. 9 shows the case where the memory element $MEa_0$ is provided with the second sense amps $SA_h$–$SA_{m-1}$, the second write buffers $WB_h$–$WB_{m-1}$, the data input/output circuits $I/O_h$–$I/O_{m-1}$. However, this is just an example. The second sense amp $SA_h$, the second write buffer $WB_h$, the second sense amp $SA_{m-1}$, the second write buffer $WB_{m-1}$, the data input/output circuit $I/O_h$–$I/O_{m-1}$, may be provided to one of the memory elements $MEa_0$–$MEa_{h-1}$, or may be distributively provided to the memory elements $MEa_0$–$MEa_{h-1}$. In this case, the corresponding second sense amp $SA_p$, the write buffer $WB_p$, and the data input/output circuit $I/O_p$ (p=h–m–1) are required to be provided to the corresponding one of the memory elements.

The second sense amp $SA_h$–$SA_{m-1}$ is connected to the corresponding data line pair for accessing by Y bit ($YD_h$, $YD_hB$)–($YD_{m-1}$, $YD_{m-1}B$), and further connected to the column gate $CG_h$–$CG_{m-1}$ corresponding to the data line pair for accessing by Y bit ($YD_h$, $YD_hB$)–($YD_{m-1}$, $YD_{m-1}B$). Likewise, the second write buffer $WB_h$–$WB_{m-1}$ is correspondingly connected to the column gate $CG_h$–$CG_{m-1}$ via the corresponding data line pair for accessing by Y bit ($YD_h$, $YD_hB$)–($YD_{m-1}$, $YD_{m-1}B$).

The second sense amp $SA_h$–$SA_{m-1}$ is connected to the corresponding data output terminal $DOUT_h$–$DOUT_{m-1}$ via the corresponding data input/output circuit $I/O_h$–$I/O_{m-1}$. The second write buffer $WB_h$–$WB_{m-1}$ is connected to the corresponding data input terminal $DIN_h$–$DIN_{m-1}$ via the corresponding data input/output circuit $I/O_h$–$I/O_{m-1}$. The data line pair for accessing by Y bit ($YD_0$, $YD_0B$)–($YD_{m-1}$, $YD_{m-1}B$) is also referred to, as a second pair of data lines.

The internal control circuit 5 enables, in response to the selection signal ZY-SEL and the write enable signal WEB from the exterior, the first sense amp 12, the second sense amp 14, $SA_h$–$SA_{m-1}$, the first write buffer 13, the second write buffer 15, $WB_h$–$WB_{m-1}$, and further controls the data input/output circuit 16, $I/O_h$–$I/O_{m-1}$. The column decoder 4 enables, in response to reception of the control signal from the internal control circuit requesting for accessing by Y bits, all column gates $CG_0$–$CG_{m-1}$ included in a desired memory element based on the address data input from the address input circuit 2. Each column gate $CG_0$–$CG_{m-1}$ in the memory element selected by the column decoder 4 outputs data through the corresponding bit line pair to the corresponding data line pair ($YD_0$, $YD_0B$),–($YD_{m-1}$, $YD_{m-1}B$) for accessing by Y bits.

In the case of writing data by Z bits, the internal control circuit 5 enables the first write buffer 13 by outputting a prescribed write control signal ZWE to the first write buffer 13, and disables the first sense amp 12, the second sense amp 14, $SA_h$–$SA_{m-1}$, and the second write buffer 15, $WB_h$–$WB_{m-1}$. The internal control circuit 5, in the case of reading data by Z bits, enables the first sense amp 12 by outputting a prescribed signal ZSE to the first sense amp, and disables the first write buffer 13, the second sense amp 14, $SA_h$–$SA_{m-1}$, the second write buffer 15, and $WB_h$–$WB_{m-1}$.

In the case of writing data by Y bits, the internal control circuit 5 enables the second write buffers 15, $WB_h$–$WB_{m-1}$ by outputting a prescribed write control signal YWE to the second write buffers 15, $WB_h$–$WB_{m-1}$, and disables the first sense amp 12, the first write buffer 13, the second sense amp 14, $SA_h$–$SA_{m-1}$. The internal control circuit 5, in the case of reading data by Y bits, enables the second sense amps 14, $SA_h$–$SA_{m-1}$ by outputting a prescribed control signal YSE to the second sense amp 14, $SA_h$–$SA_{m-1}$, and disables the first sense amp 12, the first write buffer 13, the second write buffer 15, and $WB_h$–$WB_{m-1}$.

The internal control circuit 5, in the case of writing data, causes the data input/output circuit 16 to operate as an input circuit that receives data from the data input terminal $DIN_i$ and transfers the data to the first write buffer 13 and the second write buffer 15. In the case of writing data by Y bits, the internal control circuit 5 further causes the data input/output circuit $I/O_h$–$I/O_{m-1}$ to operate as an input circuit that receives data from the corresponding input terminal $DIN_h$–$DIN_{m-1}$ and outputs the data to the second write buffer $WB_h$–$WB_{m-1}$.

The internal control circuit 5, in the case of reading data, causes the data input/output circuit 16 to operate as an output circuit that receives data from either the first sense amp 12 or the second sense amp 14 and outputs the data to the corresponding data output terminal $DOUT_i$. In the case of reading data by Y bits, the internal control circuit 5 further causes the data input/output circuit $I/O_h$–$I/O_{m-1}$ to operate as an output circuit that receives data from the corresponding second sense amp $SA_h$–$SA_{m-1}$ and outputs the data to the corresponding output terminal $DOUT_h$–$DOUT_{m-1}$.

The bit line pairs ($BL_0$, $BL_0B$)–($BL_{m-1}$, $BL_{m-1}B$) are connected to the respective data line pairs for accessing by Y bits ($YD_0$, $YD_0B$)–($YD_{m-1}$, $YD_{m-1}B$) by the corresponding column gate $CG_h$–$CG_{m-1}$ controlled by the column decoder 4. The column decoder 4 outputs the control signals so that the bit line pair $BL_k$, $BL_kB$ is not connected simultaneously to both the data line pairs for accessing by Z bits ($ZD_0$, $ZD_0B$)–($ZD_{h-1}$, $ZD_{h-1}B$) and the data line pairs for accessing by Y bits ($YD_0$, $YD_0B$)–($YD_{m-1}$, $YD_{m-1}B$). In each block of FIG. 9, "12" refers to the first sense amp; "13" refers to the first write buffer; "14" and $SA_h$–$SA_{m-1}$ refer to the second sense amps; and "15" and $WB_h$–$WB_{m-1}$ refer to the second write buffers.

In the semiconductor memory apparatus 1a having the above construction, the case of m=4 and h=2 will be described below.

Figure 10:
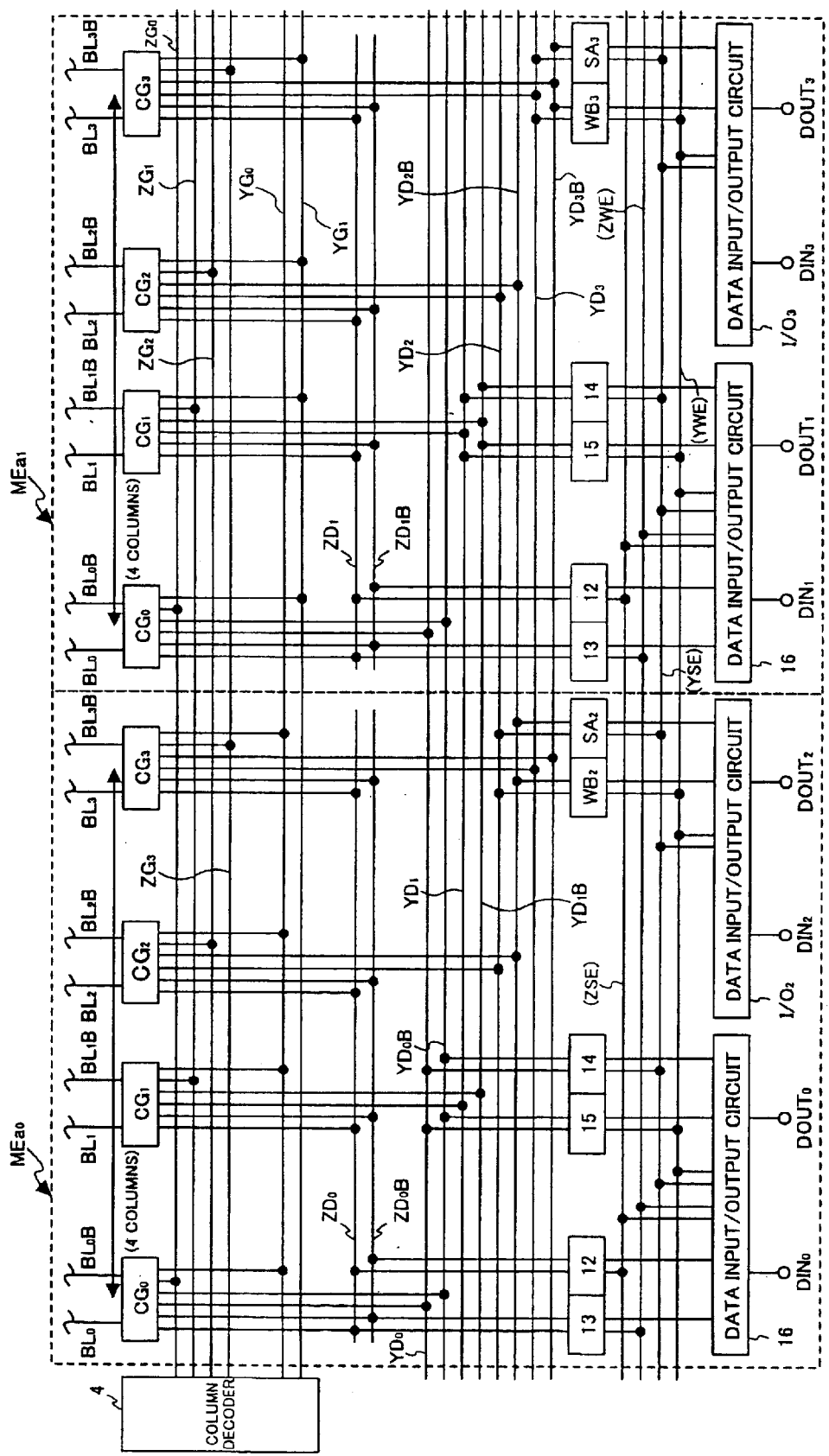
FIG. 10 is a partial block diagram showing an example of the semiconductor memory apparatus of FIG. 9 in the case of m=4 and h=2.

FIG. 10 is a block diagram showing the semiconductor memory apparatus 1a of FIG. 9 in the case of m=4 and h=2. In FIG. 10, the relationship between the column decoders, column gates, sense amps, write buffers and the data input/output circuit is showed. The portion other than the above is omitted.

In FIG. 10, what is different from FIG. 9 is that the memory element $MEa_0$ is provided with a second sense amp $SA_2$, a second write buffer $WB_2$, and a data input/output circuit $I/O_2$. The memory element $MEa_1$ is provided with a second sense amp $SA_3$, a second write buffer $WB_3$, and a data input/output circuit $I/O_3$.

In the case of writing data by Z bits, the first write buffer 13 and the data input/output circuit 16 are enabled in response to reception of a high level write control signal ZWE. The data input/output circuit 16 operates as an input circuit that receives data from a corresponding data input terminal and outputs the data to the first write buffer 13 and the second write buffer 15. The first sense amp 12, the second sense amp 14, $SA_2$, $SA_3$, the second write buffer 15, $WB_2$, $WB_3$, the data input/output circuit $I/O_2$, and $I/O_3$ are disabled in response to reception of low level control signals ZSE, YWE, YSE.

In the case of reading data by Z bits, the first sense amp 12 and the data input/output circuit 16 are enabled in response to reception of a high level read control signal ZSE. The data input/output circuit 16 operates as an output circuit that receives data from the first sense amp 12 and outputs the data to the corresponding data output terminal. The first write buffer 13, the second sense amp 14, $SA_2$, $SA_3$, the second write buffer 15, $WB_2$, $WB_3$, and the data input/output circuit $I/O_2$, and $I/O_3$ are set in a disable state in response to reception of a low level control signals ZWE, YWE, YSE.

In the case of writing data by Y bits, the second write buffer 15, $WB_2$, $WB_3$, the data input/output circuit 16, $I/O_2$, $I/O_3$ are enabled in response to a high level write control signal YWE. The data input/output circuit 16 operates as an input circuit that receives data from a corresponding data input terminal and outputs the data to the first write buffer 13 and the second write buffer 15. Additionally, the data input/output circuits $I/O_2$, $I/O_3$ operate as input circuits that receive data from corresponding data input terminals and output the data to the second write buffers $WB_2$, $WB_3$, respectively. The first sense amp 12, the first write buffer 13, the second sense amp 14, $SA_2$, and $SA_3$ are disabled in response to reception of low level control signals ZSE, ZWE, and YSE.

Additionally, in the case of reading data by Y bits, the second sense amp 14, $SA_2$, $SA_3$, the data input/output circuit 16, $I/O_2$, and $I/O_3$ are enabled in response to a high level read control signal YSE. The data input/output circuit 16 operates as an output circuit that receives data from the second sense amp 14 and outputs the data to the data output terminal. The data input/output circuits $I/O_2$, $I/O_3$ operate as output circuits that receive data from the corresponding second sense amps $SA_2$, $SA_3$ and output the data to the corresponding data output terminals $DOUT_2$ and $DOUT_3$. The first sense amp 12, the first write buffer 13, the second write buffer 15, $WB_2$, $WB_3$ are disabled in response to reception of low level control signals ZSE, ZWE, and YWE.

The bit line pairs ($BL_0$, $BL_0B$)–($BL_3$, $BL_3B$) are correspondingly connected to the data line pairs for accessing by Y bits ($YD_0$, $YD_0B$)–($YD_3$, $YD_3B$) by the corresponding column gates $CG_0$–$CG_3$ controlled by the column decoder 4. The column decoder 4 outputs the control signals so that the bit line pairs ($BL_0$, $BL_0B$)–($BL_3$, $BL_3B$) are not simultaneously connected to both the data line pairs for accessing by Z bits ($ZD_0$, $ZD_0B$), ($ZD_1$, $ZD_1B$), and the data line pairs for accessing by Y Bits ($YD_0$, $YD_0B$)–($YD_3$, $YD_3B$). In addition, in each block of FIG. 10, "12" refers to the first sense amp; "13" refers to the first write buffer, "14", $SA_2$, $SA_3$ refer to the second sense amps; "15", $WB_2$, $WB_3$ refer to the second write buffers, and $CG_0$–$CG_3$ refer to the column gates.

Figure 11:
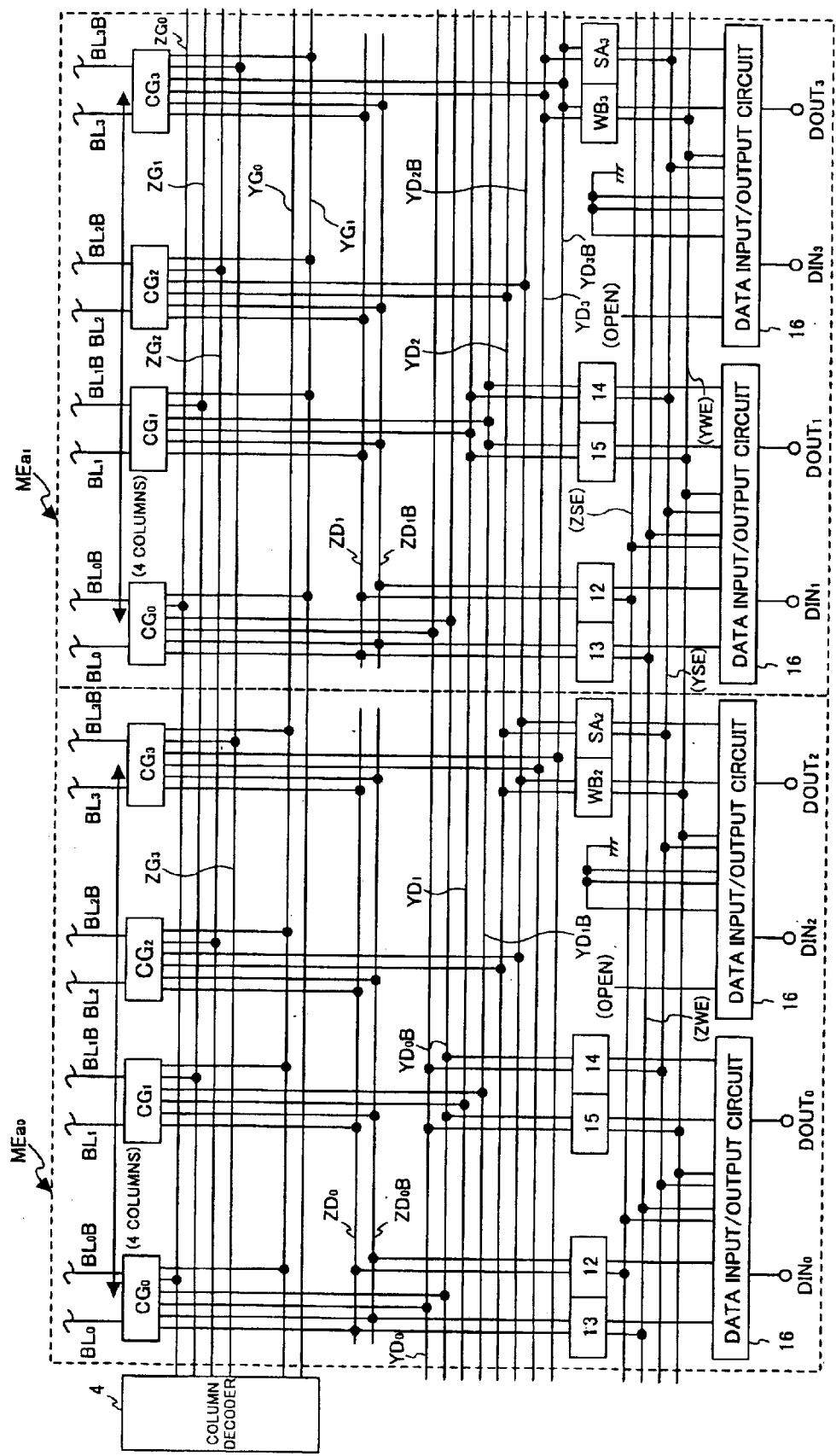
FIG. 11 is a partial block diagram showing another example of the semiconductor memory apparatus of FIG. 9 in the case of m=4 and h=2.

FIGS. 9 and 10 show the cases where the data input/output circuits $I/O_h$–$I/O_{m-1}$ are dedicated to the accessing by Y bits. However, the data input/output circuit $I/O_h$–$I/O_{m-1}$ of FIGS. 9 and 10 can be replaced by the data input/output circuit 16. In this case, FIG. 10 is changed as showed in FIG. 11. In FIG. 11, the data input/output circuits $I/O_2$ and $I/O_3$ of FIG. 10 are replaced by the data input/output circuits 16. However, the first sense amp 12 and the first write buffer 13 are not connected to them, and the control signals ZSE and ZWE are not input.

Accordingly, in the data input/output circuit 16 that is replaced, the input terminals to which the control signals ZSE and ZWE are input are grounded. The input terminals to which the second sense amps $SA_2$ and $SA_3$ are fixed at either a high level or a low level. Additionally, the output terminals to which the second write buffers $WB_2$ and $WB_3$ are connected may be left open.

In the embodiment of the semiconductor memory apparatus 1 described above, when accessing the memory cell array 11 by Z bits, each column gate $CG_0$–$CG_{m-1}$ in each memory element $ME_0$–$ME_{h-1}$, in response to a control signal from the column decoder 4, connects the corresponding bit line pair ($BL_0$, $BL_0B$)–($BL_{m-1}$, $BL_{m-1}B$) to the activated first sense amp 12 and the activated first write buffer 13 through the data line pair ($ZD_0$, $ZD_0B$)–($ZD_{h-1}$, $ZD_{h-1}B$) (for addressing by Z bits).

When accessing the memory cell array 11 by Y bits, each column gate $CG_0$–$CG_{m-1}$ in each memory element $ME_0$–$ME_{h-1}$, in response to a control signal from the column decoder 4, connects the corresponding bit line pair ($BL_0$, $BL_0B$)–($BL_{m-1}$, $BL_{m-1}B$) to the activated second sense amp 14 and the activated second write buffer 15 through the data line pair ($YD_0$, $YD_0B$)–($YD_{h-1}$, $YD_{h-1}B$) (for addressing by Y bits).

Accordingly, one can integrate a complex circuit including a plurality of RAMs in which data stored in the RAMs can be accessed using various addressing methods into the semiconductor memory apparatus 1 described above so that one can reduce the chip size.

As described above, in the case of the semiconductor memory apparatus according to the present invention, a memory space of the semiconductor memory apparatus is accessible using a plurality of different addressing types such as the bit slice type and the word slice type. Compared with a conventional semiconductor memory apparatus, the circuit area and power consumption can be reduced. Furthermore, the number of terminals is also reducible so that the area of wiring region is reduced. By using different pairs of data lines such as the first pair of data lines and the second pair of data lines, the sense amps and write buffers can be disposed on the other side of the corresponding memory cell array so as to avoid congestion of wiring and consequent degrading of performance.

The preferred embodiments of the present invention are described above. The present invention is not limited to these embodiments, but various variations and modifications may be made without departing from the scope of the present invention.

This patent application is based on Japanese priority patent applications No. 2001-316918 and No. 2002-051050 filed on Oct. 15, 2001, and Feb. 27, 2002, respectively, the entire contents of which are hereby incorporated by reference.

What is claimed is:

1. A semiconductor memory apparatus having a plurality of memory elements and a control circuit controlling each of the memory elements in response to control signals and address data input from an exterior,
    wherein
        each of the memory elements comprises:
            a memory cell array;
            a first pair of data lines provided to the memory cell array;
            a plurality of second pairs of data lines provided to each column of the memory cell array, shared by corresponding columns of the other memory elements;
            a plurality of column gates provided to each column of the memory cell array, connecting, in response to a control signal from the control circuit, a pair of bit lines to the first pair of data lines or the corresponding one of the second pairs of data lines;
            a first sense amp that outputs, when data are to be retrieved, in response to a control signal from the control circuit, the signal output through the first pair of data lines;
            a first write buffer that stores, when data are to be stored, in response to a control signal from the control circuit, the data in the memory cells through the first pair of data lines;
            a second sense amp that outputs, when data are to be retrieved, in response to a control signal from the control circuit, the signal output through the corresponding one of second pairs of data lines;
            a second write buffer that stores, when data are to be stored, in response to a control signal from the control circuit, the data in desired one of the memory cells through the second pair of data lines.

2. The semiconductor memory apparatus as claimed in claim 1, wherein the control circuit, in response to a prescribed control signal from the exterior requesting to access the memory cell arrays by bit slice type addressing, causes the column gate to connect the corresponding pair of bit lines to the first pair of data lines.

3. The semiconductor memory apparatus as claimed in claim 2, wherein the control circuit, in response to the prescribed control signal from the exterior requesting to access the memory cell arrays by bit slice type addressing and to a prescribed write control signal from the exterior requesting to store data in each memory element, causes each memory element to enable the first write buffer and disable the first sense amp, the second write buffer, and the second sense amp.

4. The semiconductor memory apparatus as claimed in claim 2, wherein the control circuit, in response to the prescribed control signal from the exterior requesting to access the memory cell arrays by bit slice type addressing and to a prescribed read control signal from the exterior requesting to retrieve data from each memory element, causes each memory element to enable the first sense amp and disable the first write buffer, the second write buffer, and the second sense amp.

5. The semiconductor memory apparatus as claimed in claim 1, wherein the control circuit, in response to a prescribed control signal from the exterior requesting to access the memory cell arrays by word slice type addressing, causes each column gate of the memory element corresponding to the address data from the exterior to connect the corresponding pair of bit lines to the second pair of data lines.

6. The semiconductor memory apparatus as claimed in claim 5, wherein the control circuit, in response to the prescribed control signal from the exterior requesting to access the memory cell arrays by word slice type addressing and to a prescribed write control signal from the exterior requesting to store data in each memory element, causes each memory element to enable the second write buffer and disable the first write buffer, the first sense amp, and the second sense amp.

7. The semiconductor memory apparatus as claimed in claim 5, wherein the control circuit, in response to the prescribed control signal from the exterior requesting to access the memory cell arrays by word slice type addressing and to a prescribed read control signal from the exterior requesting to retrieve data from each memory element, causes each memory element to enable the second sense amp and disable the first sense amp, the first write buffer, and the second write buffer.

* * * * *